(12) United States Patent
Golick et al.

(10) Patent No.: US 8,334,467 B2
(45) Date of Patent: Dec. 18, 2012

(54) LEAD FRAME DESIGN TO IMPROVE RELIABILITY

(75) Inventors: Larry W. Golick, Nazareth, PA (US);
Qwai Hoong Low, Cupertino, CA (US);
John W. Osenbach, Kutztown, PA (US);
Matthew E. Stahley, Schnecksville, PA (US)

(73) Assignee: LSI Corporation, Milpitas, CA (US)

(*) Notice: Subject to any disclaimer, the term of this patent is extended or adjusted under 35 U.S.C. 154(b) by 612 days.

(21) Appl. No.: 12/486,592

(22) Filed: Jun. 17, 2009

(65) Prior Publication Data

US 2010/0319987 A1   Dec. 23, 2010

(51) Int. Cl.
*H01L 23/48* (2006.01)
(52) U.S. Cl. .................. 174/531; 257/676; 257/674
(58) Field of Classification Search .......... 257/676, 257/674, 669; 174/531
See application file for complete search history.

(56) References Cited

U.S. PATENT DOCUMENTS

| | | | | |
|---|---|---|---|---|
| 5,386,625 | A * | 2/1995 | Tsukamoto | 29/835 |
| 5,619,065 | A * | 4/1997 | Kim | 257/673 |
| 6,069,406 | A * | 5/2000 | Wasaki | 257/773 |
| 6,553,657 | B2 * | 4/2003 | Miyaki et al. | 29/827 |
| 6,710,431 | B2 * | 3/2004 | Shibata | 257/669 |
| 6,797,540 | B1 * | 9/2004 | Li et al. | 438/111 |
| 7,005,728 | B1 * | 2/2006 | Li | 257/675 |
| 7,714,419 | B2 * | 5/2010 | Camacho et al. | 257/670 |
| 2002/0121670 | A1 * | 9/2002 | Minamio et al. | 257/459 |
| 2004/0159917 | A1 * | 8/2004 | Madrid | 257/666 |
| 2006/0091506 | A1 * | 5/2006 | Kim et al. | 257/672 |
| 2006/0138615 | A1 * | 6/2006 | Sato et al. | 257/666 |

* cited by examiner

*Primary Examiner* — Hung Ngo

(57) ABSTRACT

An electronic device package 100 comprising a lead frame 150 having at least one lead 110 with a notch 205. The notch includes at least one reentrant angle 210 of greater than 180 degrees and the notch is located distal to a cut end 1010 of the lead.

14 Claims, 11 Drawing Sheets

US 8,334,467 B2

LEAD FRAME DESIGN TO IMPROVE RELIABILITY

TECHNICAL FIELD

This application is directed, in general, to electronic device packages and their method of manufacture and, more specifically, to lead frame designs for device packages.

BACKGROUND

Wire-bonded lead frame packages often incorporate metal plating on the package's leads to provide a surface that is compatible with the wire bonding. In some cases, however, these packages have poorer-than-expected reliability.

SUMMARY

One embodiment of the disclosure is a method of manufacturing an electronic device package. The method comprises providing a lead frame, the lead frame having a plurality of leads attached thereto. The method also comprises forming a notch in at least one of said leads. The notch includes at least one reentrant angle of greater than 180 degrees. The notch is located distal to a pre-defined separation region of the lead.

Still another embodiment of the disclosure is an electronic device package. The package comprises a lead frame having at least one lead with a notch. The notch includes at least one reentrant angle of greater than 180 degrees and the notch is located distal to a cut end of the lead.

BRIEF DESCRIPTION OF THE DRAWINGS

The various embodiments can be understood from the following detailed description, when read with the accompanying figures. Various features may not be drawn to scale and may be arbitrarily increased or reduced in size for clarity of discussion. Reference is now made to the following descriptions taken in conjunction with the accompanying drawings, in which.

DETAILED DESCRIPTION

Figure 1A:
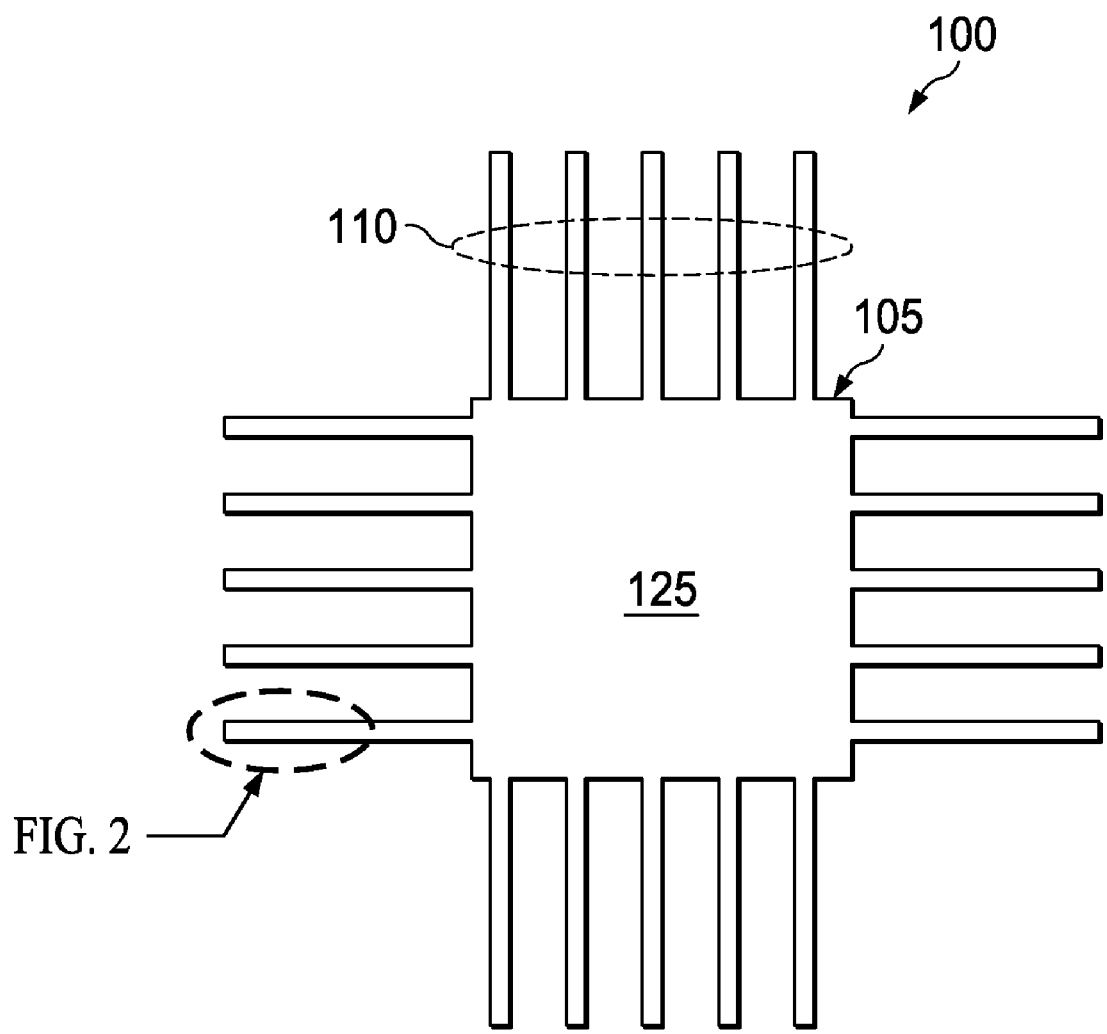
FIG. 1A presents a plan view of an example lead frame of at a stage of manufacture in accordance with the disclosure.

Certain metals used to plate lead frames can be susceptible to electrochemical migration when an external voltage bias is applied across two or more leads. Electrochemical migration can cause short circuits in the lead frame package, and, therefore reduce the reliability of the package. It is therefore desirable to prevent having such metals exposed in the finally assembled package. For certain lead frame packages, however, it is possible for these plated metals to become freshly exposed when the ends of the leads are severed from the lead frame. Nevertheless, because the ends of the leads are designed to be passivated with solder (e.g., Pb-containing solder) when attached to the printed circuit board (PCB), any freshly exposed plated metal on the leads prior to exposure to solder is not expected to pose a reliability risk.

Contrary to these expectations, as part of the present disclosure, we discovered that the plated metal that is freshly exposed during the severing of leads can become the sites of the rapid growth of metal formations, commonly referred to as "whiskers." Moreover, the whiskers can rapidly form and grow even without the application of an external voltage bias, and, can occur prior to PCB and Pb-solder attachment.

Once formed, metal whiskers can cause device failure in several different ways. Metal whiskers may not be passivated by the Pb-solder during PCB attachment, and therefore may continue to grow, or, undergo electrochemical migration, which of which can result in a short circuit that causes device failure. Metal whiskers may fracture and separate from a lead, e.g., as a result of handling during PCB assembly, and land on part of the PCB that is not exposed to Pb-solder. Subsequent handling could dislodge the whisker which could then cause a short circuit resulting in device failure. Metal whiskers may fracture and separate from a lead and contaminate the test hardware used to test device PCB assembly and packaging, thereby causing the test hardware to operate incorrectly.

The present disclosure mitigates metal whisker formation by preventing the metal plate from being freshly exposed when the leads are severed. We discovered that metal plating can unintentionally occur underneath a plating mask. Consequently, a thin layer of metal plating can extend underneath the plating mask to the region of the lead that is designed to be cut when the leads are severed from the lead frame. We further discovered that introducing a notch in a lead in the vicinity of where the plating mask overlaps with the lead can help prevent the metal plating from extending underneath the plating mask. Because there is no metal plating in the region of the lead that is cut when the leads are severed from the lead frame, metal whiskers are not formed.

During plating, there is a high electric field in the vicinity of the notch, which results in additional metal plating in the vicinity of the step up to the leading edge of the step in the direction of the plating mask. This in turn, helps to prevent metal plating under the plating mask. Because plating underneath the plating mask is prevent, there is no metal plating in the region of the lead that is designed to be cut. Consequently, there is no freshly exposed plated metal when the leads are severed, and therefore, whisker formation is mitigated.

One embodiment of the present disclosure is a method of manufacturing an electronic device package. FIGS. 1-9 present perspective, plan and cross-sectional views of an example device package 100 at selected stages of manufacture.

FIG. 1A presents a plan view of an example lead frame 105 which is provided as part of the method. The lead frame 105 has a plurality of leads 110. One of ordinary skill in the art would be familiar with the processes to manufacture a variety of lead frames types. For instance, one skilled in the art would be familiar with techniques (e.g., photolithography) to define a design layout 115 (FIG. 1B) on a metal sheet 120 (e.g., copper or aluminum), and, how to remove parts of the metal sheet 120 outside of the design layout 115 (e.g., stamping or etching) to form the lead frame 105 and leads 110 (FIG. 1A).

In some cases, as depicted in FIG. 1A, the lead frame 105 can be configured as a quad flat pack (QFP) type lead frame. Non-limiting examples of other configurations of the lead frame 110 include fusion qual type lead frames, lead frames appropriate for plastic dual in-line integrated circuit packages (PDIP), small outline integrated circuits (SOICs), thin QFPs (TQFPs), low profile QFPs (LPQFPs), small shrink outline plastic packages (SSOP), thin SSOPs (TSSOPs), thin very small-outline packages (TVSOPs), or, other types of lead-containing lead frame packages.

Figure 1B:
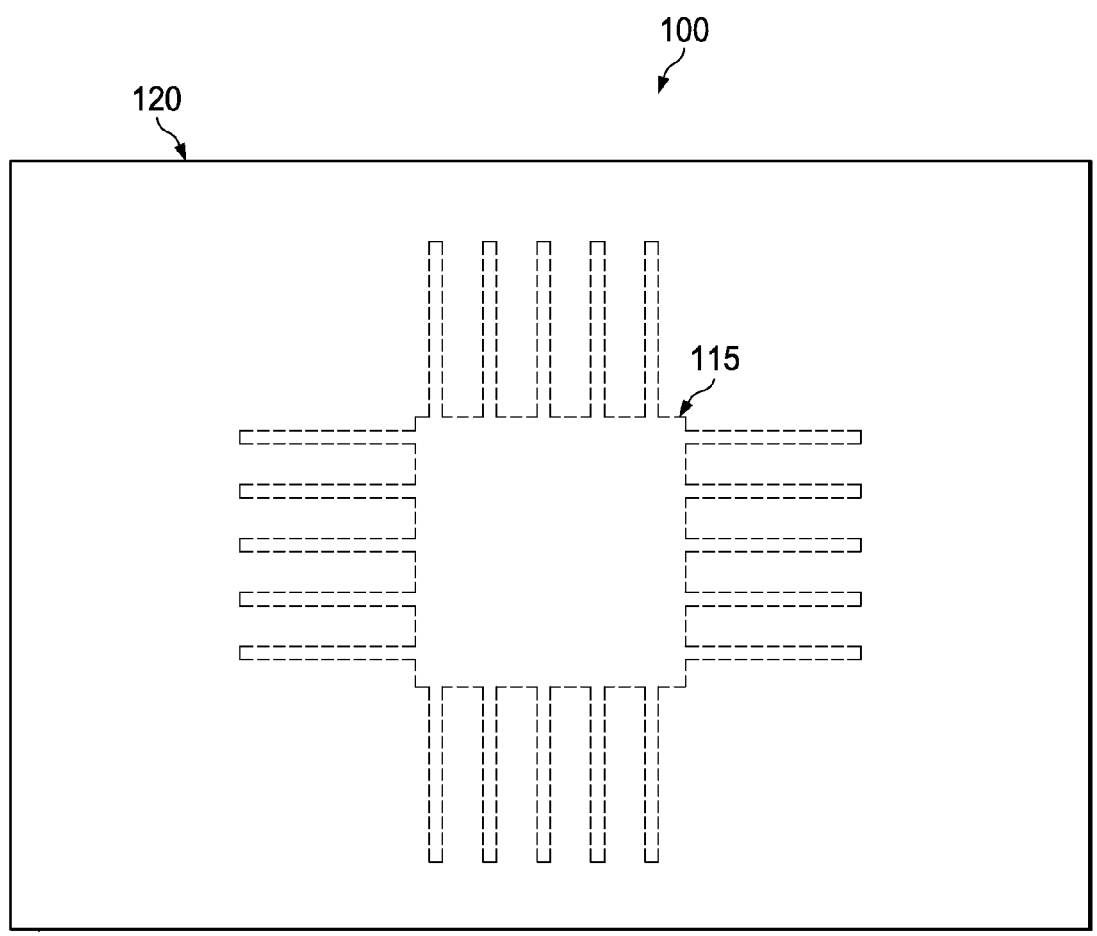
FIG. 1B presents a plan view of an example design layout for an example lead frame of the disclosure.
Figure 2:
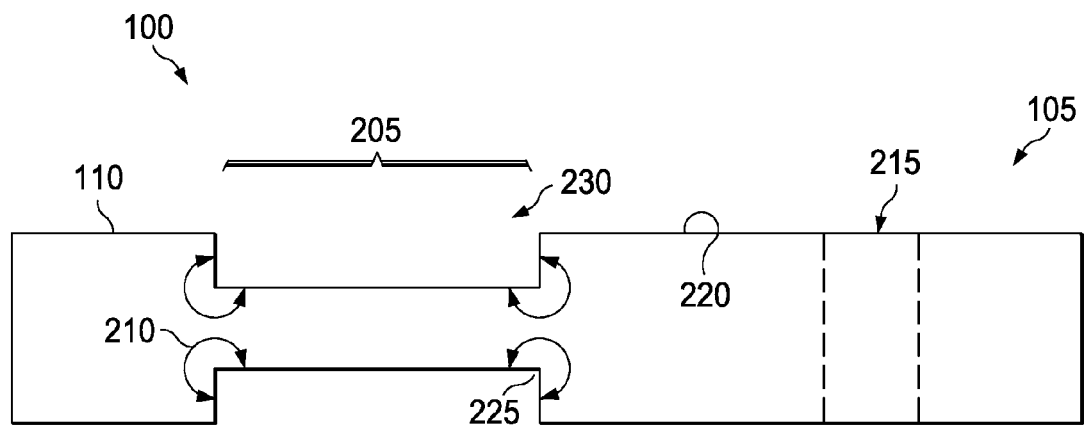
FIG. 2 presents a plan view of an example lead at a stage of manufacture in accordance with the disclosure.
Figure 3:
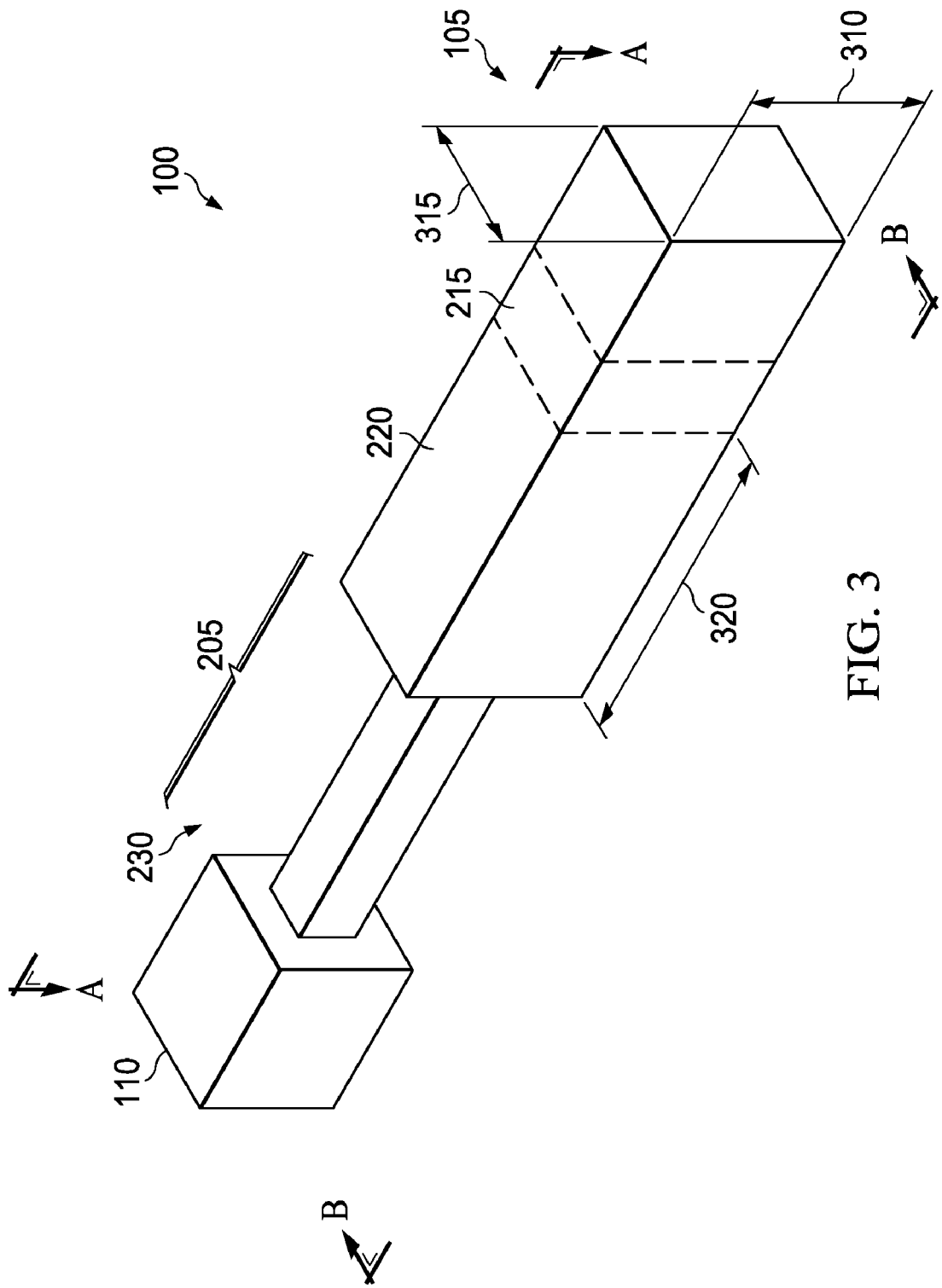
FIG. 3 presents a perspective view of an example lead at a stage of manufacture in accordance with the disclosure.

FIG. 2 presents a higher magnification plan view (corresponding the structure shown within region 2 in FIG. 1) to show the detailed features for one of the plurality of leads 110 of the example lead frame 105 in FIG. 1. FIG. 3 presents a perspective view corresponding to the plan view of FIG. 2, e.g., along view line A-A, in FIG. 3. For this example embodiment a cross-section view along view line B-B would be substantially the same as the plan view shown in FIG. 2. In other embodiments, however, the leads 110 may be asymmetrically dimensioned along these two view lines.

FIGS. 2 and 3 show the package 100 after forming a notch 205 in at least one of the plurality of leads 110. The notch 205 includes at least at least one reentrant angle 210 of greater than 180 degrees. The notch 205 is located distal to a pre-defined separation region 215 of the lead 110.

In some cases, the notch 205 can be formed as part of the process to manufacture the lead frames 105. For instance, the notch can be included in the design layout 115 formed on the metal sheet 120 and then formed as part of removing parts of the metal sheet outside of the design layout 115 (FIG. 1B). In other cases a lead frame 105, prefabricated with notch-less leads 110, is further processed to form the notch 205 in the at least one lead 110. For instance, one or more of the leads 110 can be subject to mechanical or laser cutting, similar to that used to cut the metal sheet 120, to form the notch 205.

The term reentrant angle 210 as used herein refers to an interior angle on an outer surface 220 of the lead 110 where the apex 225 of the angle 210 faces into the interior of the lead 110. The term pre-defined separation region 215 as used herein refers to that portion of the lead 110 that is designed to be cut in order to isolate the lead 110 from other parts of the lead frame 105 (e.g., mounting portion 125, FIG. 1A).

In some preferred embodiments, to maximally reduce the likelihood of whisker formation, it is preferable to form a notch 205 in each one of the leads 110. Nevertheless, it is still possible that that a notch-less lead, adjacent to one or more notched leads, could have reduced whisker formation. For instance the high electric field associated with the notches in the notched leads could cause reduced metal plating in the pre-defined separation region 215 of an adjacent notch-less lead.

To further maximally reduce the likelihood of whisker formation, as illustrated in FIG. 3, it is also preferable for the notch 205 to circumscribe lateral dimensions (e.g., a thickness 310 and width 315) of the lead 110 which are perpendicular to a long dimension 320 of the lead 110. That is, the notch 205 goes all the way around the lead 110, thereby providing a high electric field strength that is uniform all the way around the notch 205 of the lead 110 when a bias voltage is applied to the lead frame 105. For example, as shown in FIG. 3, when the lead 110 has a rectangular shape, the notch 205 can be formed in both the thickness and width dimensions 310, 315. Or, when the lead 110 is cylindrically-shaped, the notch 205 can be in the cylindrical dimension perpendicular (not shown) to the long dimension 320 of the lead 110.

There can still be cases, however, when forming the notch 205 on only one side or two sides of the lead 110 can still help to deter whisker formation. For instance, forming notches 205 in the thickness dimension 310 and covering the width dimension 315 with a mask can deter metal plating in the pre-defined separation region 215, and hence reduce the chances of whisker formation. For instance, in some cases, the high electric field associated with the notch 205 may draw a sufficient amount of current to the notch 205 so as to reduce metal plating in the pre-defined separation region 215, even though the notch 205 is only present on one side of the lead 110. Additionally such configuration can be advantageous when having the notch 205 circumscribe the lateral dimensions 310, 315 would mechanically weaken the lead 110 to an excessive degree.

Figure 4A:
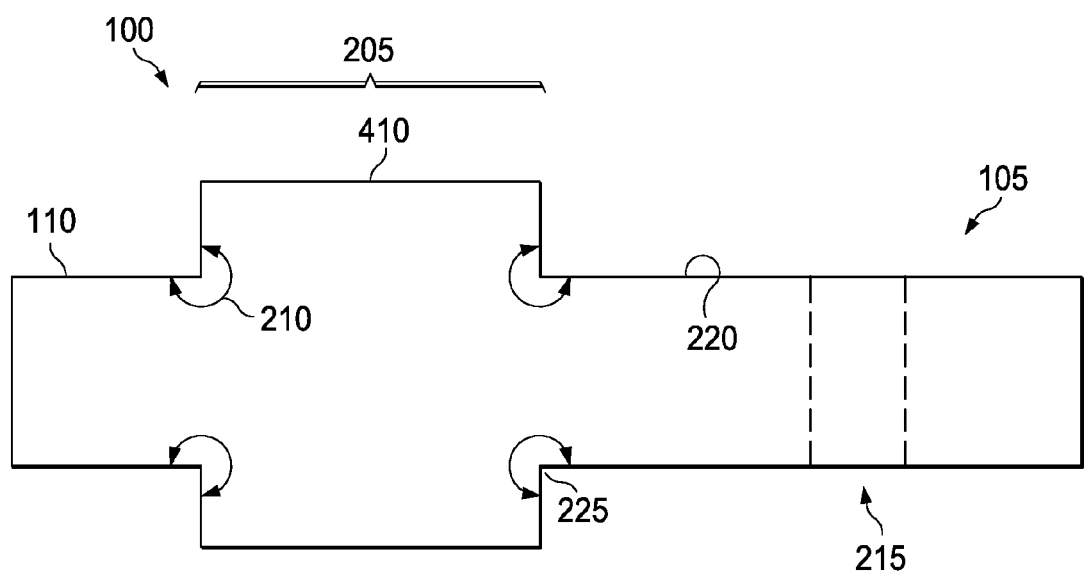
FIG. 4A presents a plan view of an example lead at a stage of manufacture in accordance with the disclosure.

As illustrated in FIG. 2, in some embodiments, forming the notch 205 includes forming an opening 230 in the lead 110. The opening 230 protrudes inward relative to an outer surface 220 of the lead 110. In other embodiments, the notch can be formed so as to protrude outward. FIG. 4A presents a plan view analogous to that shown in FIG. 2, showing an example embodiment of a notch 205 formed by the method where the notch 205 has a step 410 that protrudes outward from the outer surface 235 of the lead 110. As illustrated, the rectangular-shaped step 410 has two reentrant angles 210 in the plane of the lead 110 that is depicted in FIG. 4A.

Figure 4B:
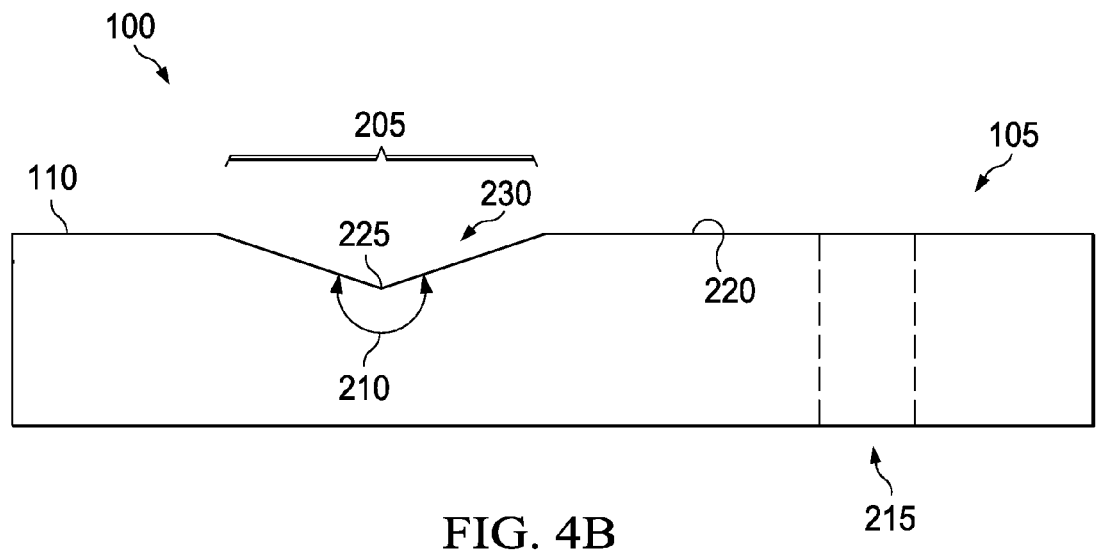
FIG. 4B presents a plan view of an example lead at a stage of manufacture in accordance with the disclosure.
Figure 4C:
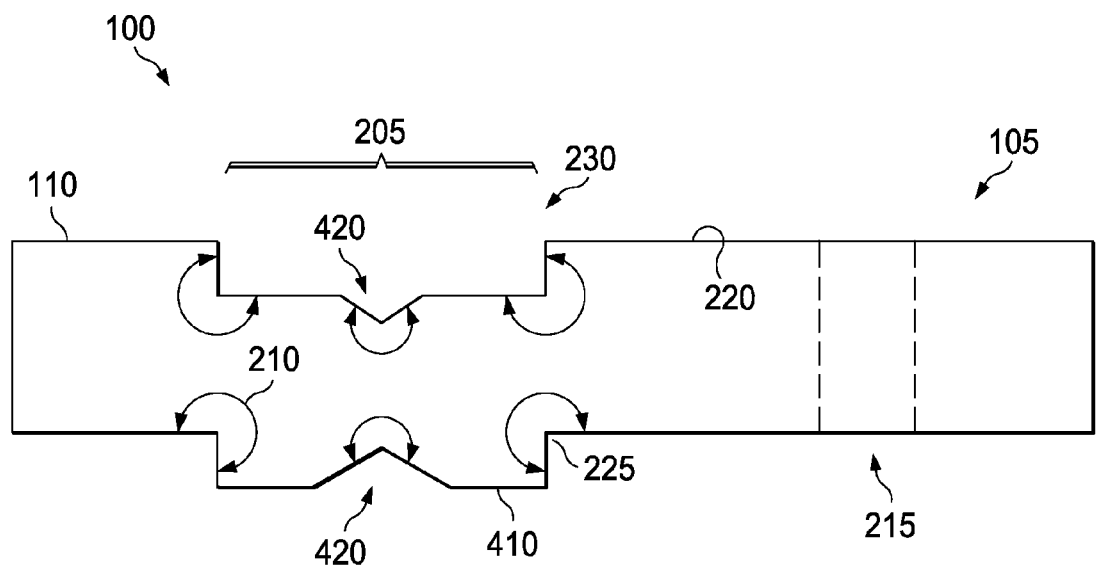
FIG. 4C presents a plan view of an example lead at a stage of manufacture in accordance with the disclosure.

FIG. 4B-4C show plan views analogous to the view shown in FIG. 2, of other example notch shapes. For instance, as shown in FIG. 4B, the notch 205 can include a wedge-shaped opening 230, here shown with a single reentrant angle 210. For instance, as shown in FIG. 4C, the notch 205 can include an opening 230 and a step 410, e.g., on different sides of the lead 110. As further illustrated in FIG. 4C, to further increase the strength of the electric field associated with the notch 205, additional reentrant angles 210 can be formed by having one or more secondary-openings 420 within the opening 230 or within the step 410 of the notch 205. Based on the present disclosure one skilled in the art would understand how the notch could be formed with a variety of opening or step shapes and combinations thereof.

Figure 5:
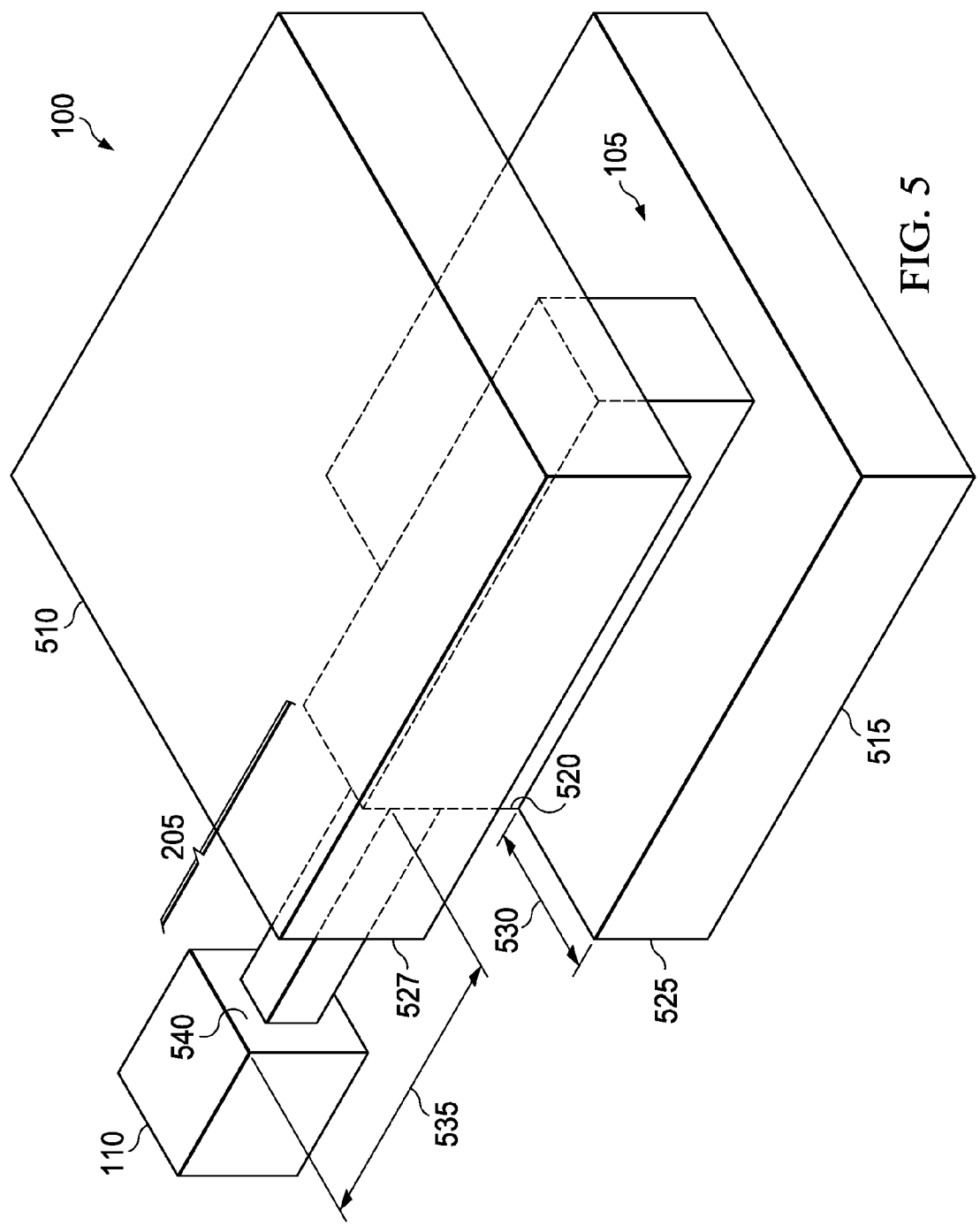
FIG. 5 presents a perspective view of an example lead and lead frame at a stage of manufacture in accordance with the disclosure.

The method can further include masking portions of the lead frame in preparation for electroplating. FIG. 5 presents a perspective view analogous to that shown in FIG. 3, showing the lead frame 105 after being placed between first and second plating mask layers 510, 515. A semi-transparent view of the mask layers 510, 515 is presented so that underlying structures of the lead frame 105 are visible. In some cases the mask layers 510, 515 are composed of a rigid insulating material such as a hard plastic or rubber. To help prevent metal plating from depositing under the mask layers 510, 515 a proximal edge 520 (e.g., the edge proximal to the center of the lead frame 105) of the notch 205 is preferably adjacent to an outer edge 525 of at least one of the, and more preferably both, edges 525, 527, of the plating mask layers 510, 515. For example, in some preferred embodiments, a mismatching distance 530 between the proximal edge 520 and the edges 525, 527, of the plating mask layers 510, 515 is less than about 10 percent of a total length 535 of the notch 205. Additionally, to facilitate metal plating in the region of the notch 205 a distal edge 540 of the notch 205 is not covered by the plating mask layers 510, 515.

Figure 6:
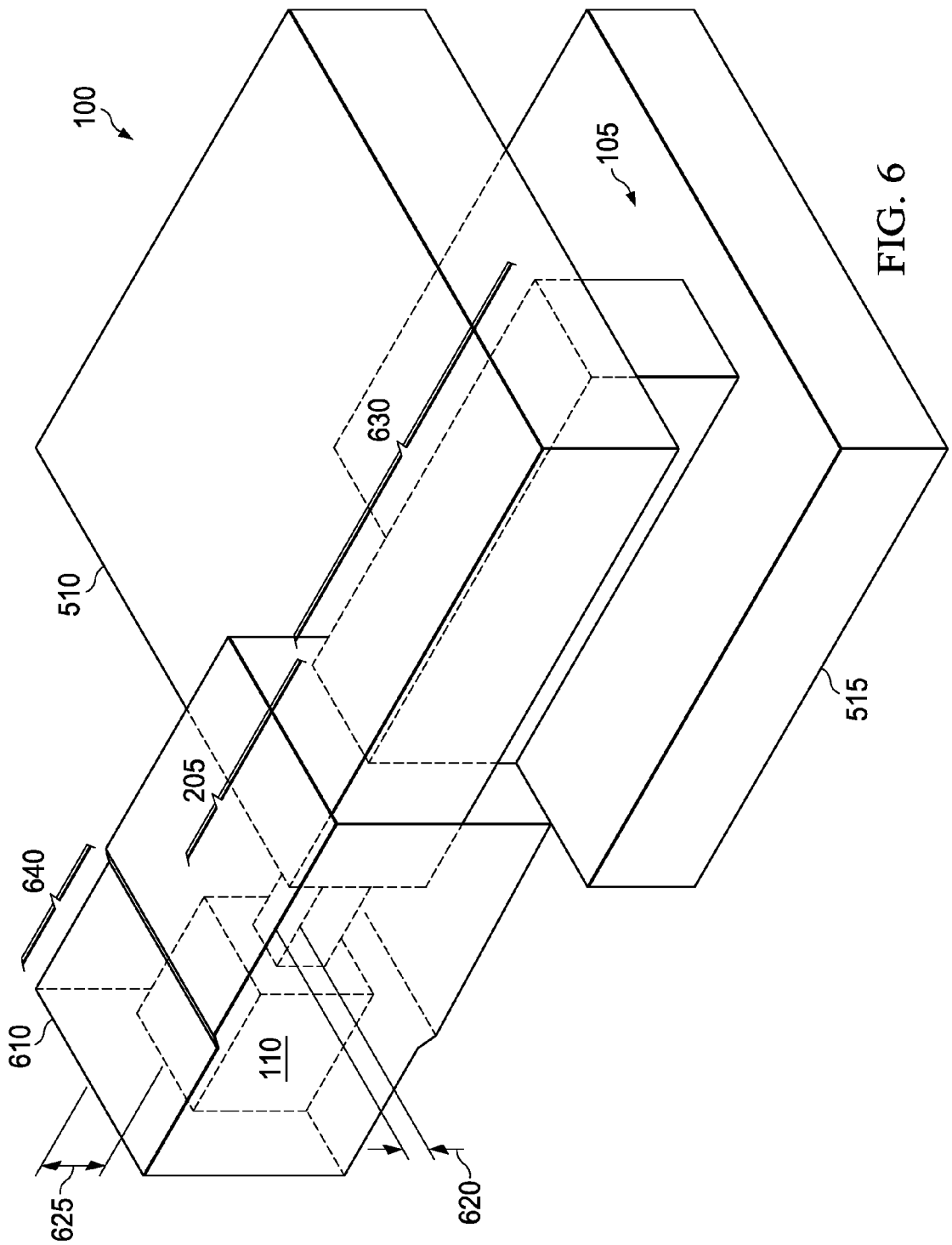
FIG. 6 presents a perspective view of an example lead and lead frame at a stage of manufacture in accordance with the disclosure.

FIG. 6 shows the lead frame 105 of FIG. 5 after electro-depositing a metal plate 610 (e.g., silver plating) on portions the lead 110 not covered by the first and second plating mask layers 510, 515. Again, semi-transparent views of the mask layers 510, 515 and metal plate 610 are presented so that underlying structures are visible.

One skilled in the art would be familiar with electro-plating processes to deposit the metal plate 610. For instance, in some cases, electro-depositing the metal plate 610 includes placing the lead frame 105 and plating mask layers 510, 515 in a metal plating solution and applying a voltage bias to the lead frame 105. For example in some embodiments, the lead frame 105 and mask layers 510, 515 are placed in a metal plating solution containing silver cations, and a negative voltage of about −0.9 Volts or greater is applied to the lead frame 105 until the desired thickness 625 of metal plating 610 is obtained. In some cases the voltage bias applied to the lead frame 105 is in a range of about −1 to −25 Volts.

Because electroplating is used, metal plate formation is driven by the strength of the electric field on the lead's surface. Due to the presence of the reentrant angle or angles 210 (FIG. 2) the electric field in the vicinity of the notch 205 will be higher than on other regions of the lead 110. Therefore, a relatively larger amount of electric current goes to the notch 205 as compared to other portions of the lead 110. This, in turn, will tends to draw more metal ions to the notch 205, and thereby prevent, or at least reduce, metal ions from plating in a proximal region 630 of the lead 110 (relative to the central portion of the lead frame 105) covered by the plating mask layer 510, 515. For example, due to the high current in the vicinity of the notch 205, a first thickness 620 of the metal plate 610 located directly over the notch 205 is greater than a second thickness 625 of the metal plate 610 located over a terminal portion 640 of the lead 110 that is distal to the notch 205. As noted above, this is in contrast to a lead frame having only notch-less leads, where some metal ions can be electro-plated under the mask layers 510, 515 (FIG. 5) and in the pre-defined separation region 215.

Figure 7:
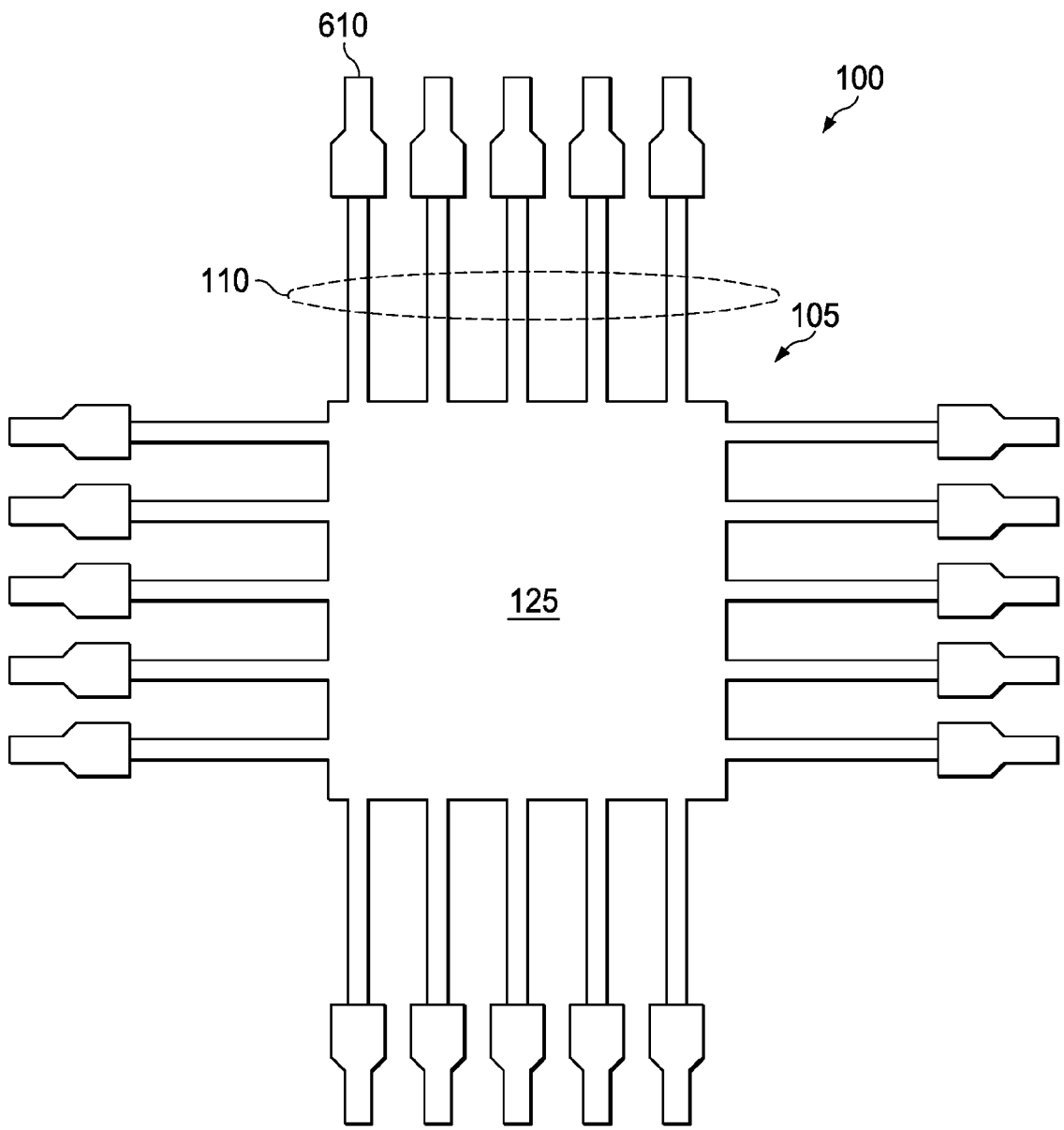
FIG. 7 presents a plan view of an example lead frame and electronic device package at a stage of manufacture in accordance with the disclosure.

FIG. 7 shows a lower magnification plan view of the lead frame 105 of the package 100 analogous to that shown FIG. 1A, after performing the method steps described in the context of FIGS. 2-6, and after removing the lead frame 105 from between the mask layer 510, 515, following the deposition of the metal plate 610. FIG. 7 illustrates an embodiment in which a plurality of leads 110 were treated according to the method steps described in the context of FIGS. 2-6. The notches 205 (FIG. 2) of the leads 110 are covered by the metal plating 610, and, due to the presence of the notch 205, the metal plating 610 is distal to the pre-defined separation region 215.

Figure 8:
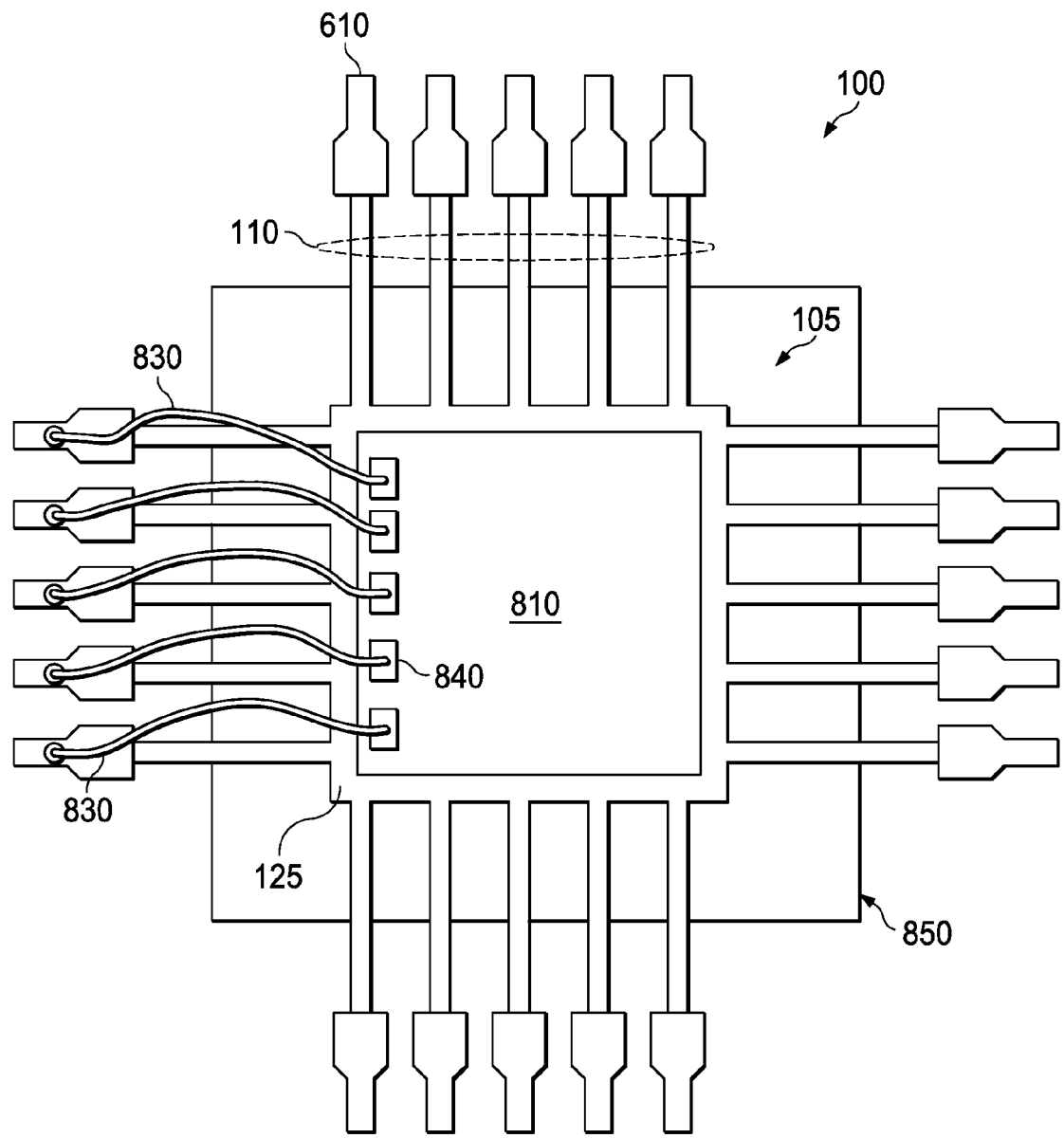
FIG. 8 presents a plan view of an example lead frame and electronic device package at a stage of manufacture in accordance with the disclosure.

FIG. 8 show the package 100 of FIG. 7, after attaching an electronic device 810 to the device mounting portion 125 of the lead frame 105 as part of the package's 100 manufacture. For instance, the electronic device 810 comprising one or more integrated circuits can be bonded to the mounting portion 125 using an adhesive glue.

FIG. 8 further shows the package 100 after bonding a wire 830 (e.g., gold wire) from a landing pad 840 of the electronic device 810 to the portion of lead 110 covered with the metal plate 610. The wire 830 facilitates the electrical interconnection of the electronic device 810 to other devices (not shown) of, or external to, the package 100. Preferably, a plurality of wire bonds are formed between the landing pads 840 and leads 110, but for clarity, only a few connections are depicted.

FIG. 8 also shows the package 100 after covering the electronic device 810 and the mounting portion 125 of the lead frame 105 with an insulating mold 850. For instance, a fluid mold 850, (e.g., organic resin or a ceramic material) can be deposited or cast-molded around the device 810 and mounting portion 125, and then allowed to solidify. The mold 850 can protect the device 810 from exposure damaging environments and can mechanically stabilize the various components of the package 100.

Figure 9:
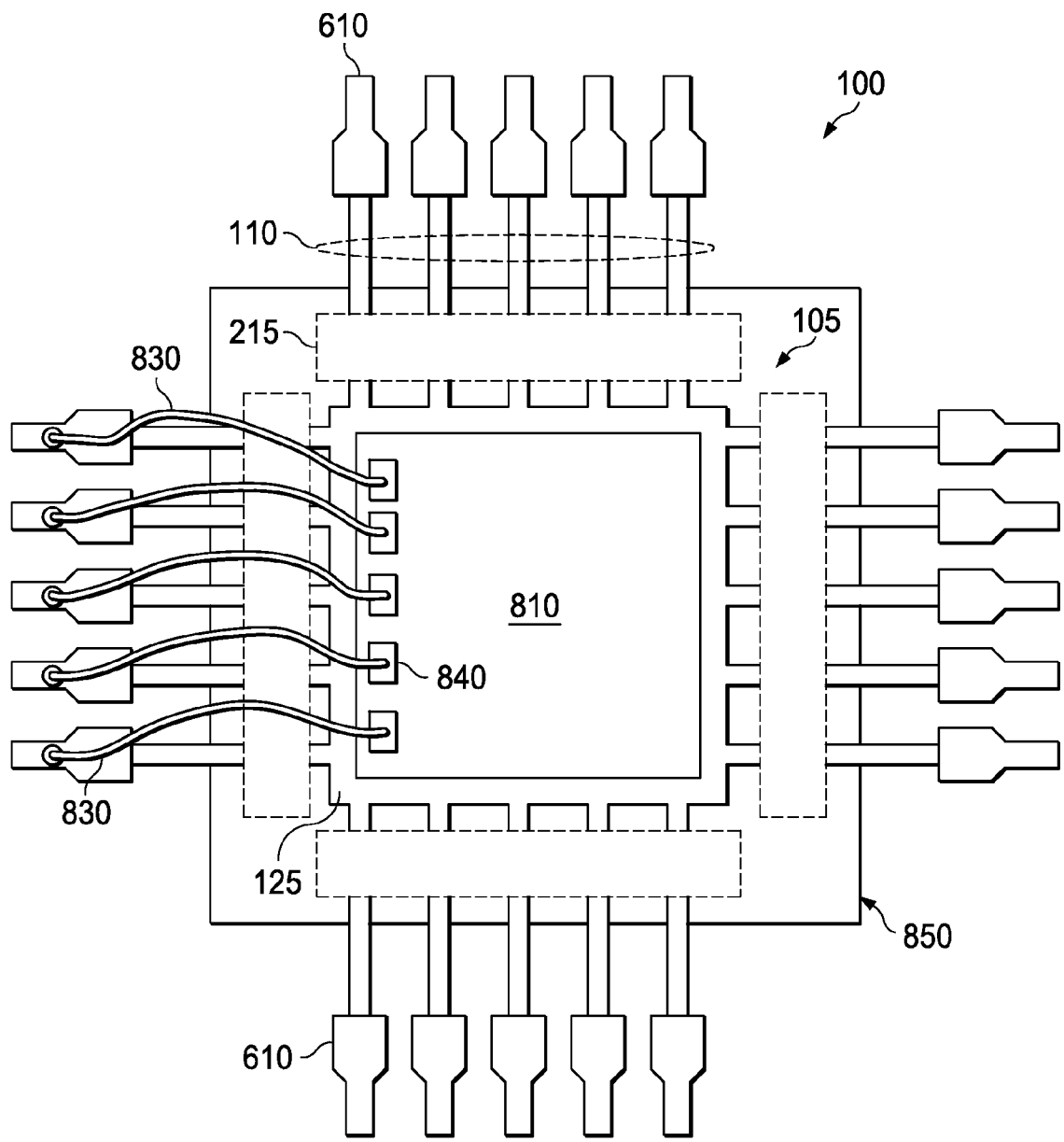
FIG. 9 presents a plan view of an example lead frame and electronic device package at a stage of manufacture in accordance with the disclosure.

FIG. 9 shows the package 100 of FIG. 8 after severing the leads 110 from the device mounting portion 125 of the lead frame 105 by cutting within the pre-defined separation regions 215 of the leads 110. Severing can be accomplished by mechanical sawing, laser cutting or other procedures well know to those skilled in the art. Similar procedures may be performed simultaneous, or in separate steps, to sever other portions of the lead frame 105, such as handling bars or other support structures (now shown).

Figure 10:
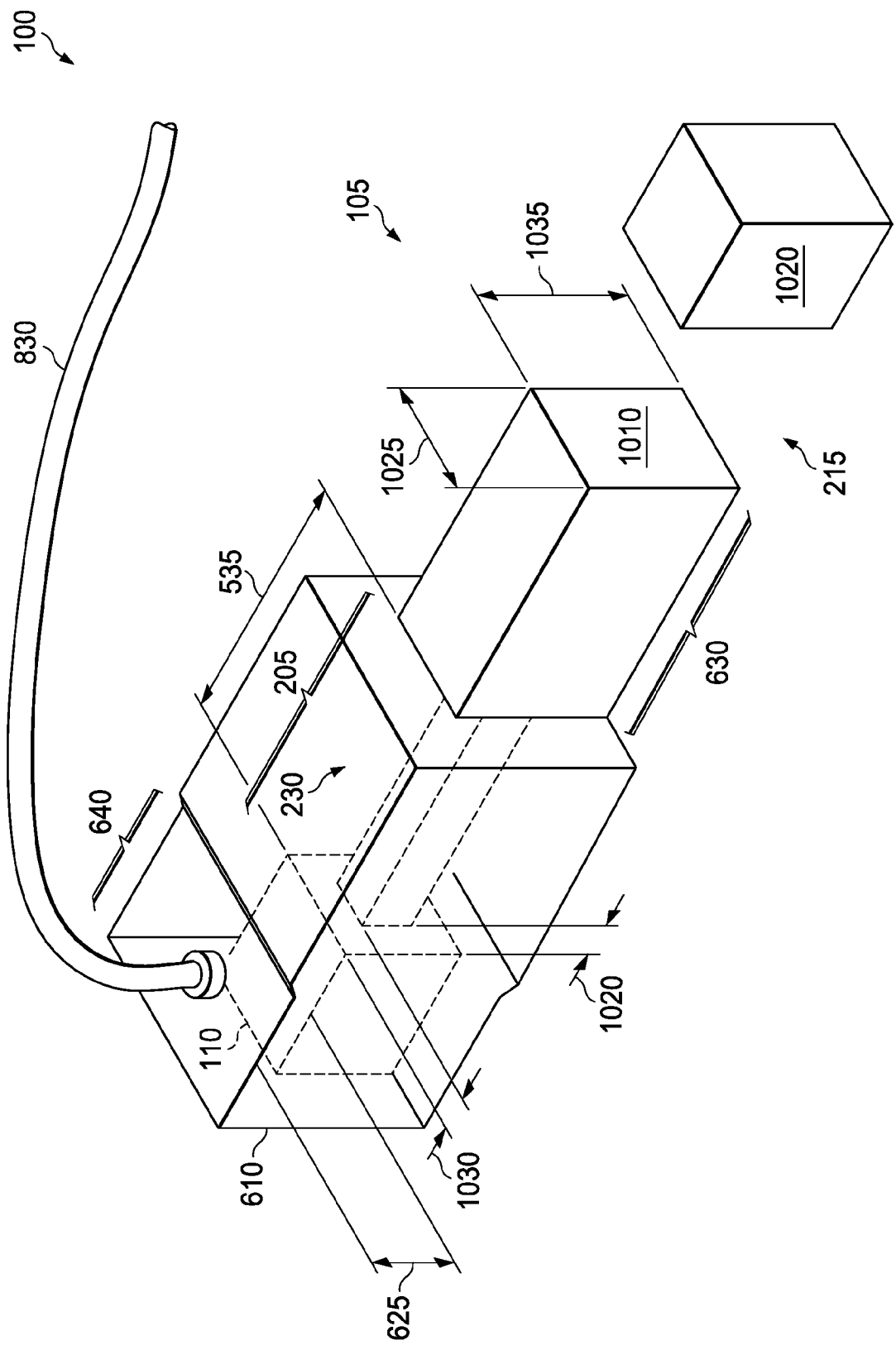
FIG. 10 presents a perspective view example electronic device package of the disclosure.

Another embodiment of the present disclosure is an electronic device package. Any of the method steps described in the context of FIGS. 1-9 could be used to provide the device package 100. FIG. 10 shows a perspective detailed view, analogous to the views shown in FIGS. 3, 5, and 6, of an example package 100 of the disclosure. For clarity, the same reference numbers are used to label features that are common to the embodiments of FIGS. 1-9. For clarity, the metal plate 610 is depicted as semi-transparent, and, the mold 950 (FIG. 9) is not depicted. FIG. 10 shows the example package 100 after performing the steps described in the context of FIGS. 1-9. In other embodiments, however, the package 100 may comprise the lead frame 105 prior to any one, or all, of the method steps described in the context of FIGS. 5-9.

As shown in FIG. 10, the electronic device package 100 comprises a lead frame 105 having at least one lead 110 with a notch 205 that includes at least one reentrant angle 210 (FIG. 2) of greater than 180 degrees. The notch 205 is located distal to a cut end 1010 of the lead 110, e.g., an end 1010 of the lead 110 severed from other portions 1020 of the lead frame 105 such as described in the context of FIG. 9 (e.g., the mounting portion 125, FIG. 8).

In some embodiments, each of a plurality of leads 110 of the lead frame 105 includes the notch 205 (FIG. 2). In some embodiments, the notch 205 circumscribes lateral dimensions 310, 315 of the lead 110, the lateral dimensions 310, 315 being perpendicular to a long dimension 320 of the lead (FIG. 3). For some embodiments, the notch 205 can include a rectangular-shaped opening 230 in a outer surface 220 of the lead 110 and have at least two reentrant angles 210 (FIG. 2). In other embodiments, however, the notch 205 can include a wedge-shaped opening, a step structure 410 that protrudes outward from the surface 220, or combinations thereof, and, the notch 205 can have one or more reentrant angles 210 (FIGS. 4A-C). Based on the present disclosure, one skilled in the art would appreciate the variety of other shapes that the notch 205 could have in order to promote having a high electric field strength in the notch region, as discussed elsewhere herein.

The dimensions of the notch 205 reflect a balance between several factors. The notch's size should be sufficiently large to promote a high electric field strength in the vicinity of the notch 205. However the notch's size should be small enough to leave the lead 110 with sufficient mechanical strength to undergo the manufacturing steps and end-use handling without breaking. For instance, too large an opening 230 could render the lead 110 too fragile to handle during the package's manufacture or end-use. The notch's size should be sufficiently large to be conducive to controlling the notch's manufacture so that the same-sized notch is reproducibly formed among the leads of a single package, or between packages.

In some preferred embodiments, the notch has an opening with a depth into the lead which does not exceed about 25 percent of a total lateral dimension of the notch-less portions of the lead. For instance, as shown in FIG. 10, the depth 1020 of the notch's 205 opening 230 in the width dimension 310 (FIG. 3) preferably does not exceed about 25 percent of the lead's total width 1025. Preferably, the depth 1030 of the notch's opening 230 in the thickness dimension 315 (FIG. 3) also does not exceed about 25 percent of the lead's total thickness 1035. Consequently, for notches 205 that circumscribe the lateral dimensions 310, 315 (e.g. FIG. 10) of the lead 110, not more that about 50 percent of the lead's width 1025 or depth 1030 (e.g., up to 25 percent on each side) is removed to form the opening 230 of a notch 205. In some preferred embodiments, the depth 1020, 1030 of the opening 230 ranges from about 5 to 25 percent, and more preferably about 10 to 15 percent, of the total lateral dimensions 310 315 (e.g., the total width 1025 and total thickness 1035) of the lead 110.

For example, consider a lead 110 that has a total width 1025 and total thickness 1035 that are each about 0.4 mm in notch-less portions of the lead 110. The depth of the opening 230 (e.g., width depth 1020 and thickness depth 1030) can be 0.1 mm on each side of the lead 110. Consider a lead 110 with a smaller total width and thickness 1025, 1035 (e.g., about 0.1 mm). The lead 110 can have a smaller opening 230 (e.g., depth of the 1020, 1030 of about 0.01 mm) to preserve the lead's strength.

In some embodiments, it is also advantageous for the opening 230 to be long so as to avoid the electric field from bridging across the notch 205 and thereby reduce the strength of the field in the vicinity of the notch 205. It is also desirable however for the opening's length 535 not to be so long as to cause the lead 110 lose stability or to not having a high field throughout the entire length of the notch 205. For instance, as shown in FIG. 10, in some preferred embodiments, the opening 230 has a length 535 equal to about 1.5 to 2.5 times the depth 1020, 1030 of the opening 230. For example consider again a lead 110 wherein the total width 1025 and thickness 1035 are each about 0.4 mm. If the depth 1020, 1030 of the notch's opening 230 was about 0.04 mm, then the length 535 of the opening preferably ranges from about 0.06 mm to 0.08 mm.

As further illustrated in FIG. 10 a terminal portion 640 of the lead 110 that is distal to the notch 205 and the notch 205 itself are preferably both covered with a metal plate 610. For instance, in some embodiments, the 110 lead comprises, or in some cases, consists essentially of, copper (e.g., 99 wt % copper or more) and the metal plate 610 comprises, or in some cases, consists essentially of, silver (e.g., 99 wt % or more silver). A first thickness 620 the metal plate 610 located directly over the notch 205 is greater (e.g., from about 10 to 100 percent greater) than a second thickness 625 of the metal plate 610 located directly over the terminal portion 630 of the lead 110 (FIG. 6). For example, in some cases, when the second thickness 620 of metal plate 610 equals about 50 microns, then the first thickness 620 can be about 55 to 100 microns.

As illustrated in FIG. 9, the package 100 can further include an electronic device 810 mounted to a mounting portion 125 of the lead frame 110. The mounting portion 125 is separated from the lead 110 or (leads 110). A portion of the lead proximal 640 to the mounting portion is substantially free of metal plating (e.g., the first thickness 620 the metal plate 610 is less than about 1 micron). The package 100 can also include wires 830 bonded from landing pads 840 of the electronic device and to a metal plate 125 covered portion of the lead 110 (e.g., the notch 205, the terminal portion 630 or both). The package 100 can also include an insulating mold 850 covering the electronic device 810 and the mounting portion 125 of the lead frame 110.

Although some embodiments of the disclosure have been described in detail, those of ordinary skill in the art should understand that they could make various changes, substitutions and alterations herein without departing from the scope of the disclosure.

What is claimed is:

1. An electronic device package, comprising:
   a lead frame having at least one lead with a notch that includes at least one reentrant angle of greater than 180 degrees and said notch is located distal to a cut end of said lead, wherein said notch goes all the way around lateral dimensions of said lead that are perpendicular to a long dimension of said lead and a terminal portion said lead that is distal to said notch, and said notch, are both covered with a metal plate.

2. The package of claim 1, wherein each of a plurality of leads of said lead frame includes said notch.

3. The package of claim 1, wherein said notch includes a rectangular-shaped opening in a plane of said lead and said notch has at least two of said reentrant angles.

4. The package of claim 1, wherein said notch has an opening with a depth into said lead which does not exceed 25 percent of a total lateral dimension of said lead.

5. The package of claim 1, wherein said opening has a length equal to about 1. 5 to 2.5 times said depth of said opening.

6. The package of claim 1, wherein a first thickness of said metal plate located directly over said notch is greater than a second thickness of said metal plate located directly over said terminal portion of said lead.

7. The package of claim 1, further including:
   an electronic device mounted to a mounting portion of said lead frame, wherein said mounting portion is separated from said lead and a portion of said lead proximal to said mounting portion is substantially free of metal plating;
   wires bonded from landing pads on said electronic device to a metal plate covered portion of said lead; and
   an insulating mold covering said electronic device and said mounting portion of said lead frame.

8. An electronic device package, comprising:
   a lead frame having at least one lead with a region of reduced cross-section located distal to a cut end of said lead, the region of reduced cross-section comprising at least one reentrant angle of greater than 180 degrees, the region of reduced cross-section circumscribing lateral dimensions of said lead that are perpendicular to a long dimension of said lead, and
   a terminal portion of said lead that is distal to said region of reduced cross-section, and said region of reduced cross-section, are both covered with a metal plate.

9. The package of claim 8, wherein each of a plurality of leads of said lead frame includes said region of reduced cross-section.

10. The package of claim 8 wherein said region of reduced cross-section includes a rectangular-shaped opening in a plane of said lead and said region of reduced cross-section has at least two of said reentrant angles.

11. The package of claim 8, wherein said region of reduced cross-section has an opening with a depth into said lead which does not exceed 25 percent of a total lateral dimension of said lead.

12. The package of claim 8, wherein said opening has a length equal to about 1.5 to 2.5 times said depth of said opening.

13. The package of claim 8, wherein a first thickness of said metal plate located directly over said region of reduced cross-section is greater than a second thickness of said metal plate located directly over said terminal portion of said lead.

14. The package of claim 8, further including:
an electronic device mounted to a mounting portion of said lead frame, wherein said mounting portion is separated from said lead and a portion of said lead proximal to said mounting portion is substantially free of metal plating;
wires bonded from landing pads on said electronic device to a metal plate covered portion of said lead; and
an insulating mold covering said electronic device and said mounting portion of said lead frame.

* * * * *